United States Patent [19]

Petersen et al.

[11] Patent Number: 5,427,536
[45] Date of Patent: Jun. 27, 1995

[54] SOCKET FOR TAB TESTING

[75] Inventors: Kurt H. Petersen; Juan P. Rios, both of Austin, Tex.

[73] Assignee: Minnesota Mining and Manufacturing Company, Saint Paul, Minn.

[21] Appl. No.: 219,519

[22] Filed: Mar. 29, 1994

[51] Int. Cl.⁶ .............................................. H01R 23/72
[52] U.S. Cl. ........................................ 439/71; 439/374
[58] Field of Search ............... 439/752, 701, 696, 70, 439/71, 72, 331

[56] References Cited

U.S. PATENT DOCUMENTS

| | | | |
|---|---|---|---|
| 4,090,770 | 5/1978 | McKee et al. | 439/696 X |
| 4,986,760 | 1/1991 | Petersen et al. | 439/71 |
| 5,288,240 | 2/1994 | Savant | 439/331 X |
| 5,308,265 | 5/1994 | Kaneko | 439/752 O R |
| 5,350,306 | 9/1994 | DelPrete et al. | 439/331 X |

*Primary Examiner*—David L. Pirlot
*Assistant Examiner*—Daniel Wittels
*Attorney, Agent, or Firm*—Gary L. Griswold; Walter N. Kirn; David W. Anderson

[57] ABSTRACT

A contact retention module for a test socket includes mating gear-like teeth formed of alternating projections and valleys. The projections of one module half close the valleys of another module half to produce pockets which retain and guide contact terminal ends within the pockets.

4 Claims, 11 Drawing Sheets

SOCKET FOR TAB TESTING

FIELD OF THE INVENTION

The present invention relates generally to a test socket for the burn-in and electrical test of tape automated bonded (TAB) very large scale integrated circuits (IC) with closely spaced contact pads.

BACKGROUND OF THE INVENTION

The high lead count of TAB IC devices or leadless chip carriers present unique problems to socket design since each contact must press against the TAB test pad with a force high enough to ensure reliable electrical contact. The force of all the contacts is additive and must be resisted by the strength of the socket. The socket must contain a sufficient number of contacts to connect the TAB IC device to an external piece of electronic test equipment. The socket must provide means to register the TAB IC device for accurate location, to control contact placement and deflection, to accept thermal expansion variations without losing contact, and to provide force at high enough levels to ensure reliable electrical connections throughout the course of thermal cycling.

One such burn-in and test socket is described in U.S. Pat. No. 4,986,760, assigned to the assignee of the present invention and incorporated herein by reference. That socket includes a comb-like contact support member which arrays the contacting tips of the contact bodies in a staggered configuration. The contact support includes a thin molded rib between adjacent contacts to provide guidance for the contact tips and electrical insulation of one contact from the others. The contact support of this prior socket is designed such that alternate contact bodies extended in opposite directions from the tips which make contact with the TAB IC devices. A difficulty with this design is revealed by the fact that rows of contacts must be arranged in a square pattern to contact the four sides of a square TAB IC device. Since half the contact bodies extended toward the center of the square pattern, the contact bodies of one row of contacts interfere with the contact bodies of another row of contacts where the rows meet to form a corner of the desired square pattern. As a result, some contacts must be left out at the corners of the pattern.

The design of the socket of the above patent is also limited in that it required the thin molded rib between adjacent contacts. As contact spacing is decreased as required by newly emerging TAB devices, this separating rib between contact becomes too thin to mold reliably and does not have sufficient strength to guide and retain the contact tips in the desired locations.

SUMMARY OF THE INVENTION

To overcome the drawbacks associated with prior test sockets for TAB IC devices, the present invention provides a test socket having a first contact support structure including linear gear-like teeth defined by projecting tapered ribs and valleys between adjacent ribs; contacts including projecting contact tips disposed within the first contact structure and arranged such that the tips of adjacent contacts are disposed one in the valley between adjacent ribs and the other aligned with the projecting rib of the first contact support structure; a second contact support structure including linear gear-like teeth defined by projecting tapered ribs and valleys between adjacent ribs; wherein the teeth of the first contact structure and the second contact structure intermesh with the ribs of one contact support structure extending only partially into the valleys between ribs of the other of the contact support structures to define a pocket at the valleys of the first contact structure and the valleys of the second contact structure which contain and guide contact tips contained therein. It is preferred that the teeth of the two contact structures be tapered from the valleys between ribs and terminate in a flat end, and the flat end of the teeth and the valleys between teeth define the pockets for the contact tips.

BRIEF DESCRIPTION OF THE DRAWINGS

The present invention will be more thoroughly described with respect to the accompanying drawings, wherein like numbers refer to like parts in the several views, and wherein.

DESCRIPTION OF THE PREFERRED EMBODIMENT

Figure 1:
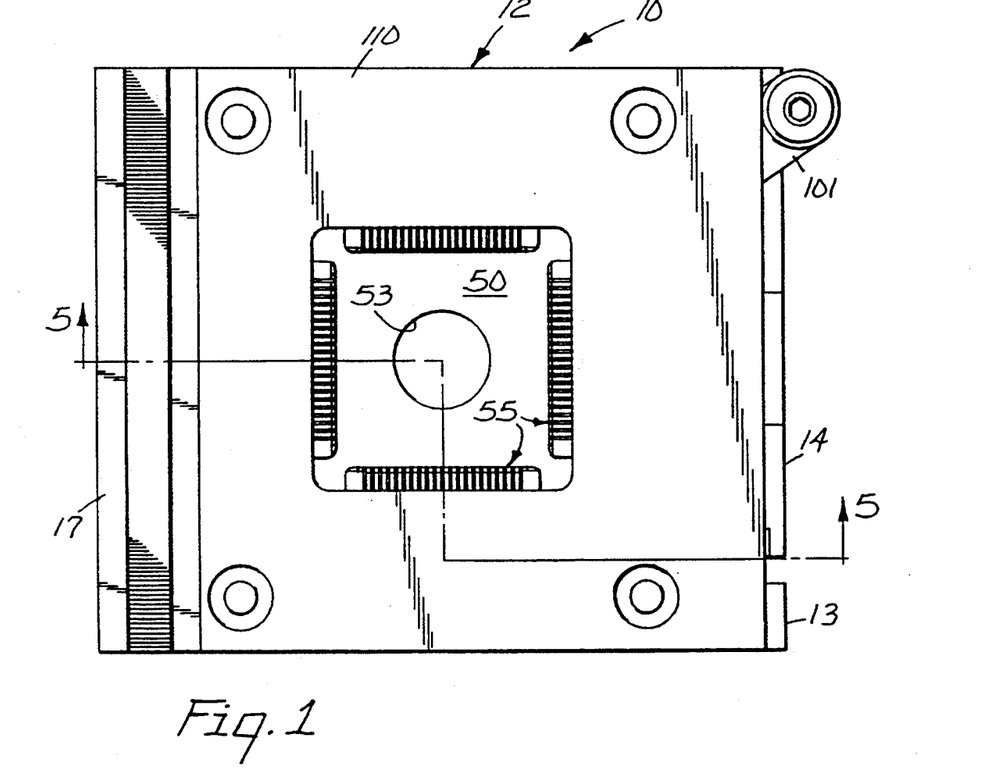
FIG. 1 is a top plan view of a socket according to the prior art.

The socket 10 of U.S. Pat. No. 4,986,760 comprises a base 11 and a lid or cover 12. The lid 12 is hinged to the base 11 by means of cooperating ears 13 and 14 and a hinge pin 15. A spring 16 biases the lid 12 to a normal raised position. The lid 12 is retained in a closed and latched position by a pivoted pawl 17. The pawl 17 is pivoted to ears 18 on the opposite side of the base by a pin 19 and a torsion spring (not shown) urges the pawl into latching position over a lip on the left edge of the lid 12 as shown in FIGS. 1, 2 and 5.

Figure 3:
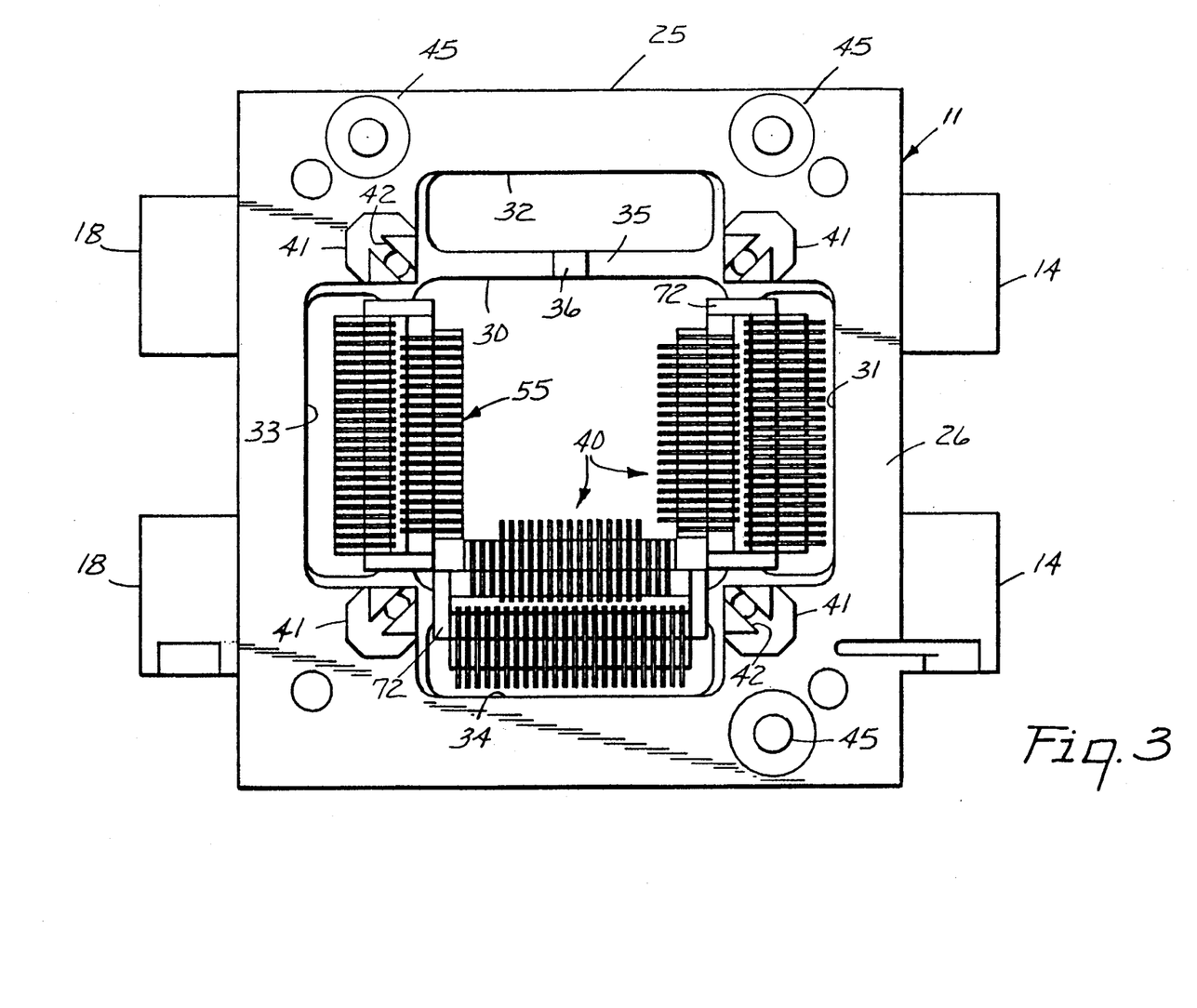
FIG. 3 is a top plan view of a base of the socket of FIG. 1 showing three of the possible four comb and contact members, with a base cover plate removed.

The base 11 comprises a machined or molded frame 25 of metal or insulative material, for example, glass reinforced polysulfone. The frame has ears 14 and 18 formed thereon, and has a top surface 26 and a bottom surface 27. As can be seen in FIG. 3, the frame 25 has a central rectangular opening 30 surrounded by symmetrically spaced openings 31, 32, 33 and 34 defining narrow, thick load-supporting beams 35 therebetween.

Each of the beams 35 has a centrally disposed positioning means in the form of a projection 36. The upper surface of the beams 35 and the area at the ends of the openings 31, 32, 33 and 34 are slightly recessed to receive comb and contact members generally designated by the numeral 40. The frame 25 is further provided with standing alignment towers 41 positioned at the corners of the opening 30. Each tower 41 has a hexagonal base which is positioned in an opening in a base cover plate 50 (FIG. 4), a smaller generally square top portion having a slot 42 formed diagonally therein, and an opening 44 extending vertically through the tower 41.

Figure 2:
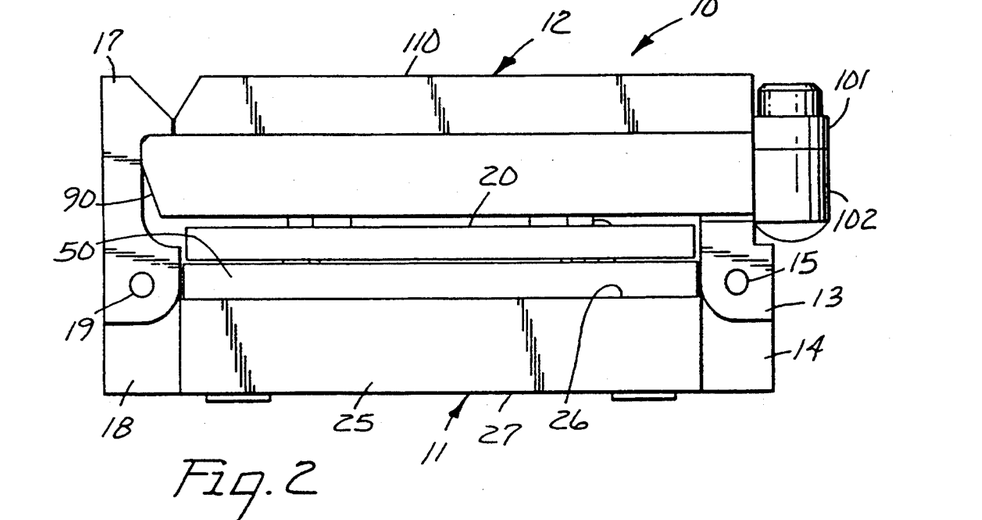
FIG. 2 is a side view of the socket of FIG. 1 with a carrier device inserted in the socket and the comb and contact members removed.
Figure 5:
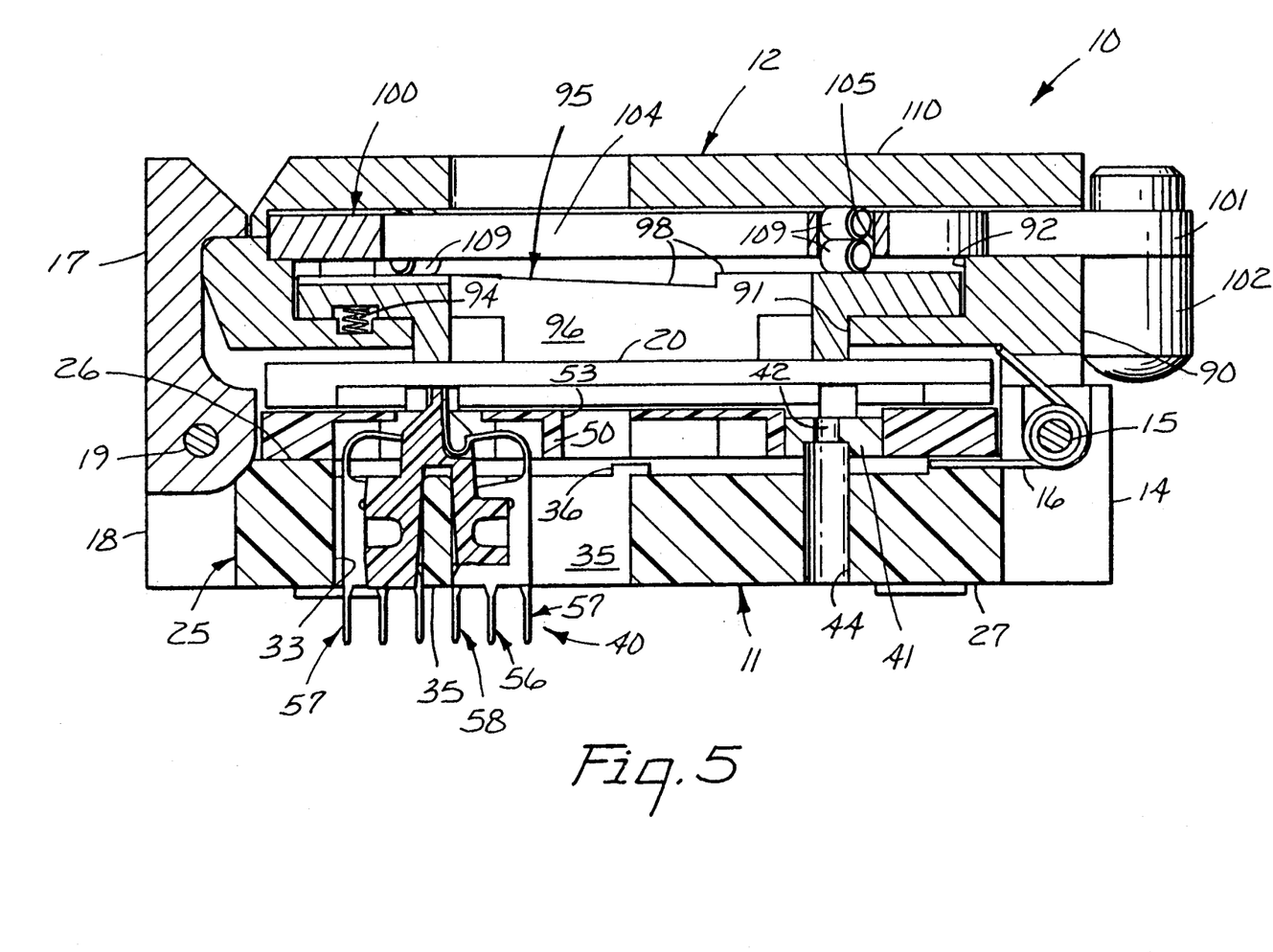
FIG. 5 is a cross-sectional view of the socket of FIG. 1 taken approximately along the line 5—5 of FIG. 1.

As best seen in FIGS. 2 and 5, the slots 42 are formed to receive pins (not shown) in a carrier, designated by reference numeral 20, which slots are positioned to locate the carrier precisely with the frame 26 and alternatively some carriers 20 have holes to receive locating pins so the openings 44 afford the installation of such locating pins. Pins 45 are positioned to locate a carrier 20 in the proper orientation and are mounted in the base frame 25 to be received in recesses in the marginal edge of the carrier. The other openings in the frame 25 are for the reception of PC board mounting screws which are used to secure the base cover plate 50 onto the frame 25 over the comb and contact members 40 and the frame 25 to the PC board of a testing device.

Figure 4:
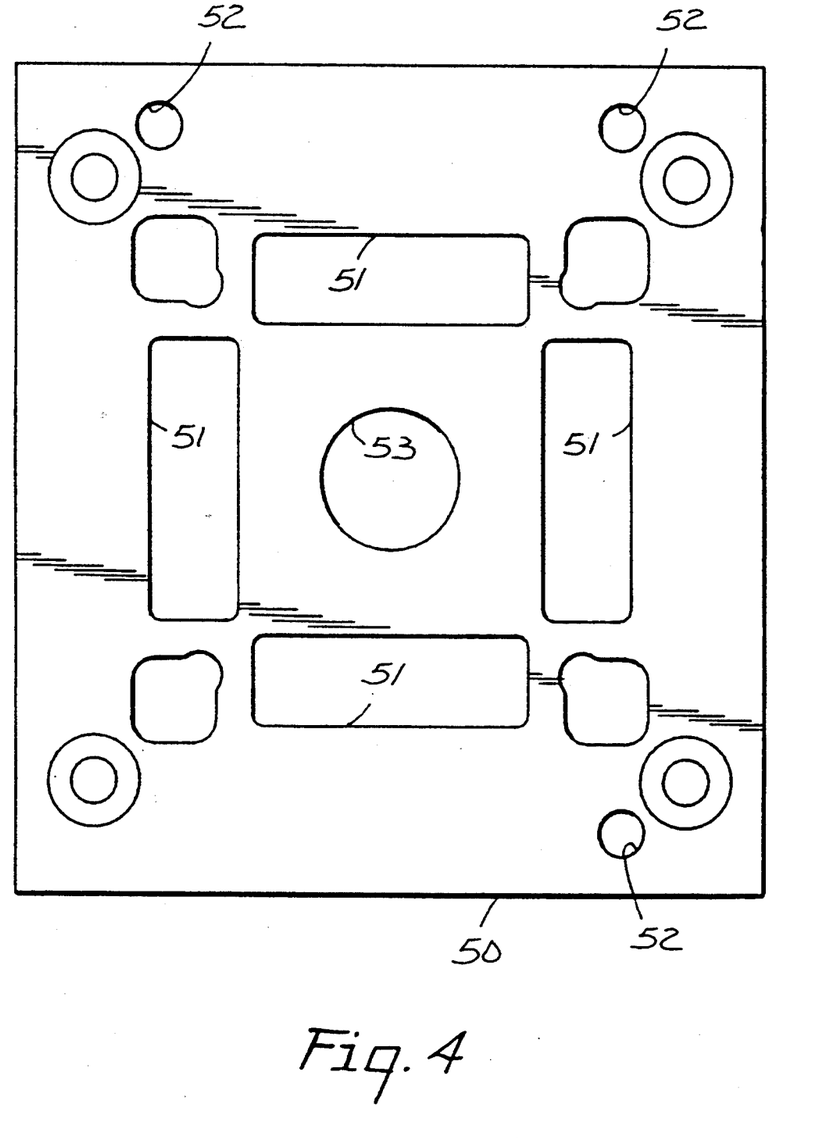
FIG. 4 is a top plan view of a base frame cover plate for the socket of FIG. 1.

The cover plate 50 rests on the surface 26 and, as shown in FIG. 4, has openings 51 through which the tops of the comb and contact members 40 extend, but the plate 50 engages tabs on the ends of the comb and contact members 40 to prevent them from being lifted off the beams 35. The plate 50 has three holes 52 to receive the alignment pins 45, a central opening 53, holes to receive the towers and holes to receive assembly fasteners.

Figure 6:
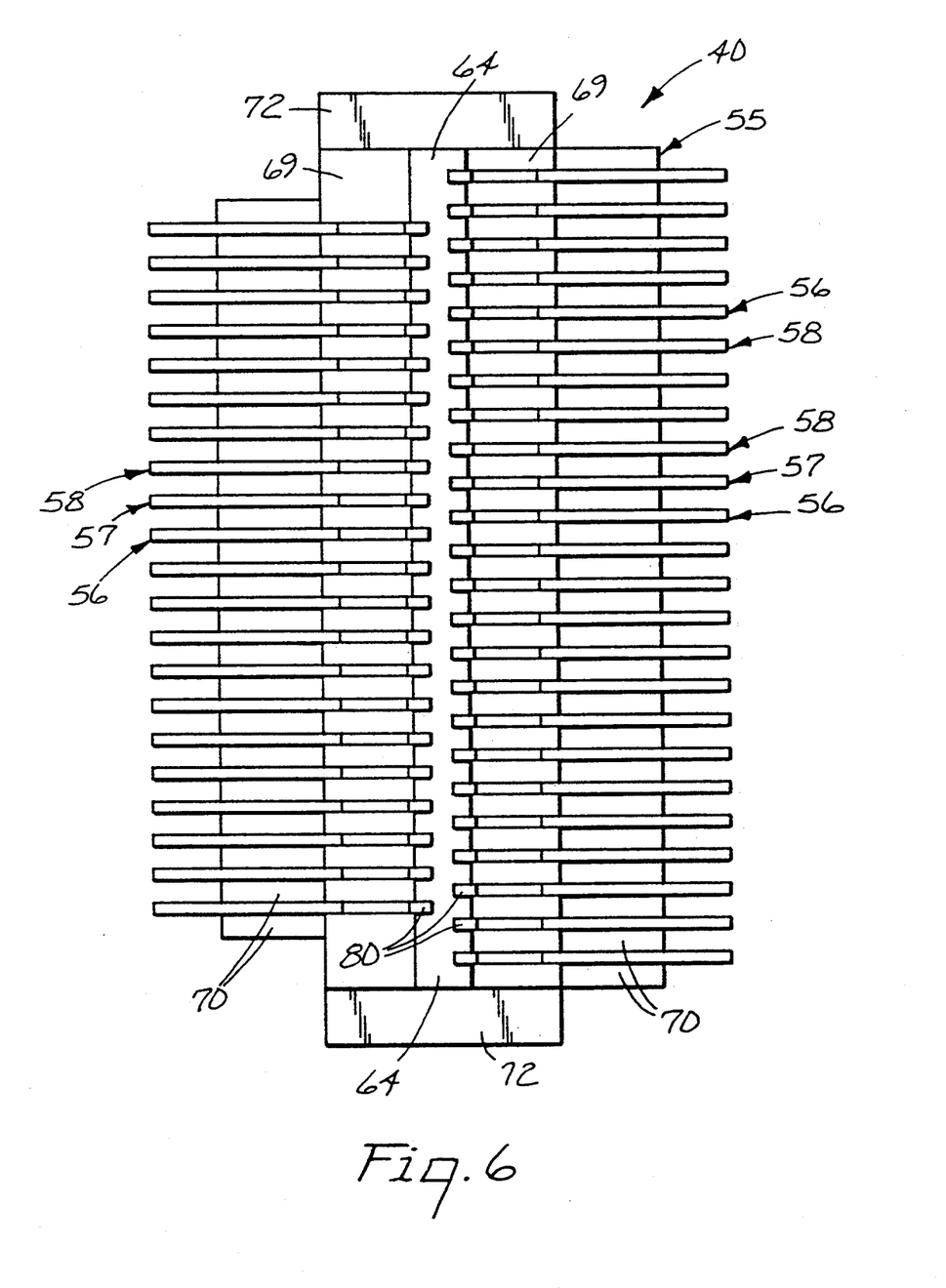
FIG. 6 is a top plan view of a comb and contact member of the socket of FIG. 1 in enlarged scale.
Figure 7:
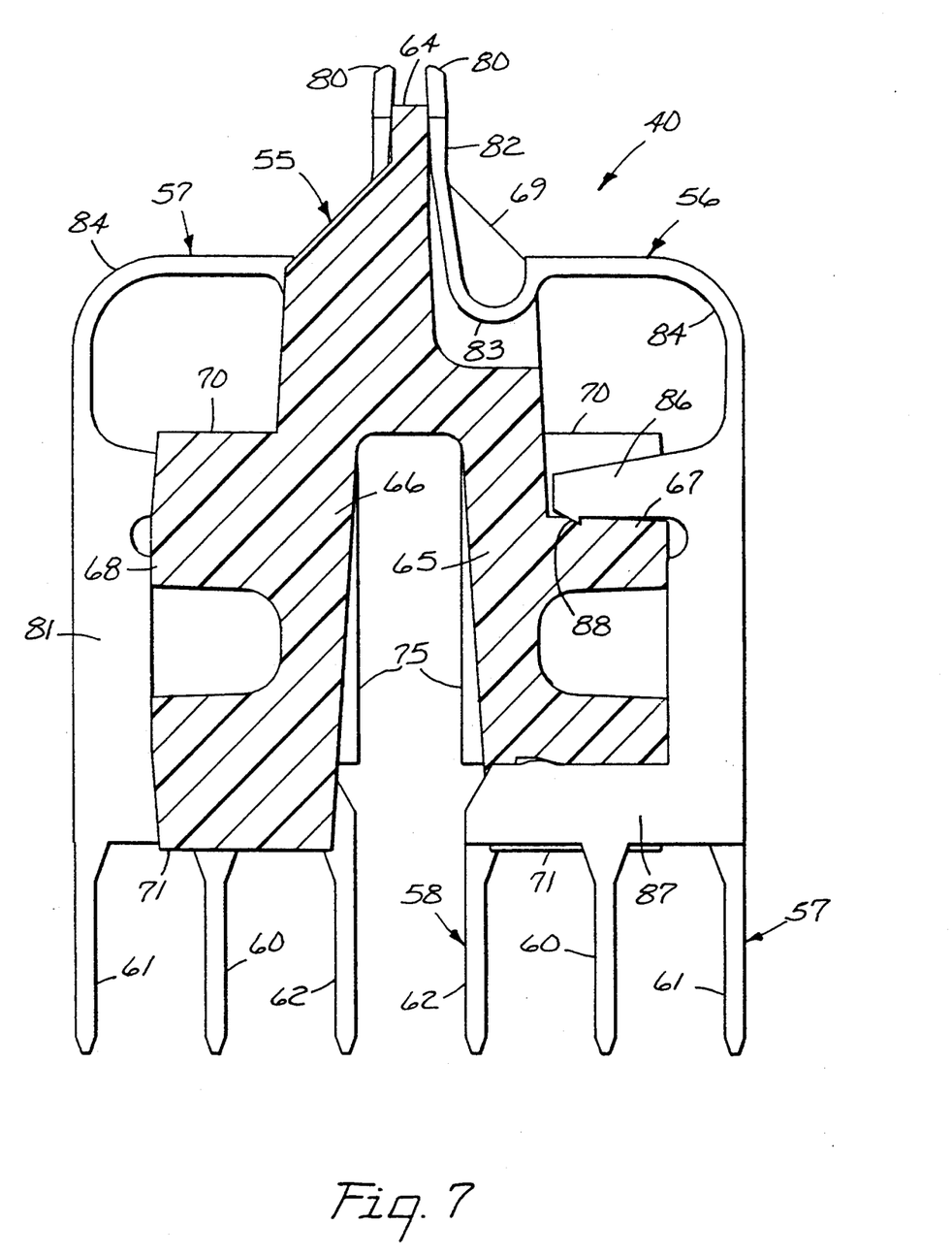
FIG. 7 is a transverse cross-sectional view of the comb and contact member of the socket of FIG. 6.
Figure 8:
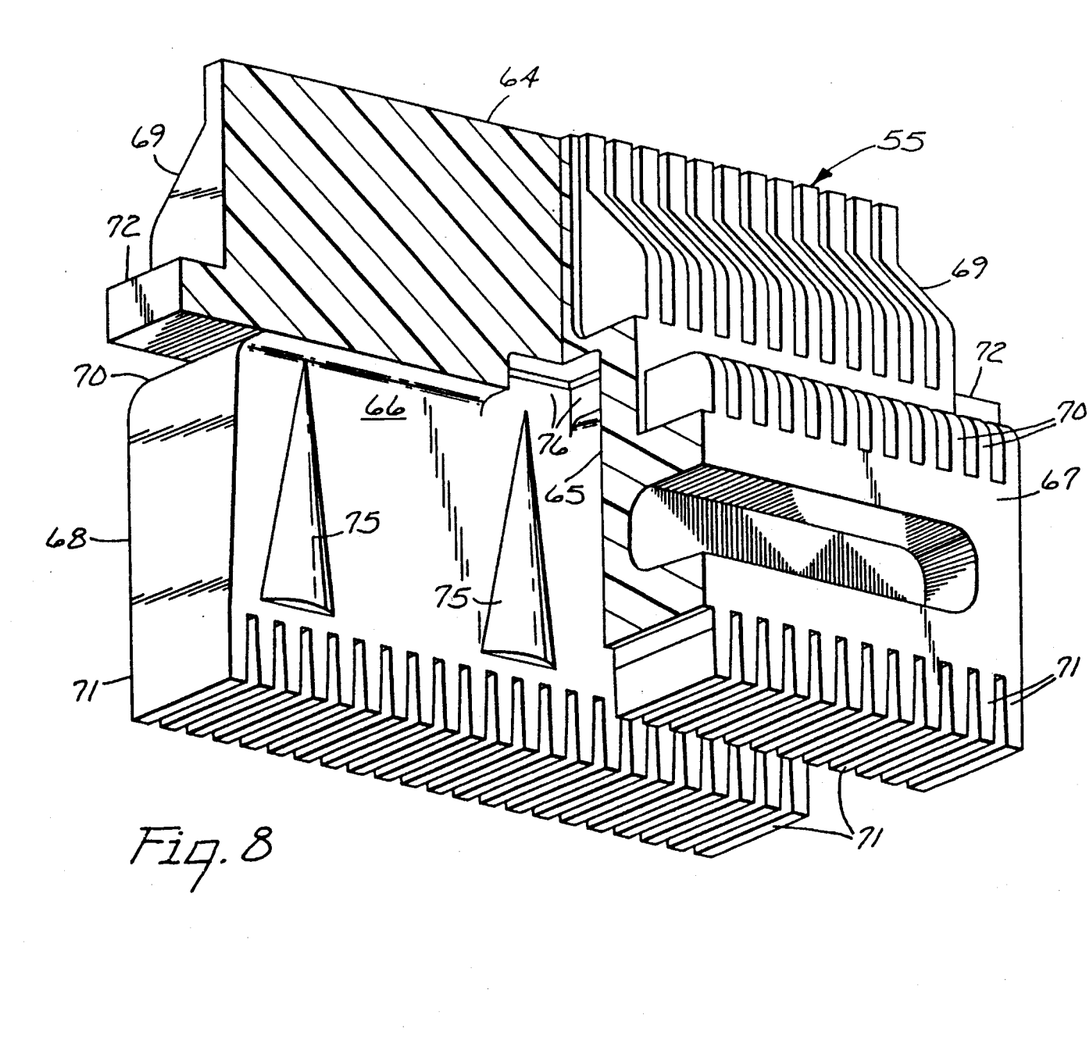
FIG. 8 is a perspective, partial vertical cross-sectional view of the comb of the socket of FIG. 6.

The comb and contact members 40 are illustrated most clearly in FIGS. 6, 7 and 8. The members 40 comprise a comb 55 and a plurality of contacts. The contacts illustrated have three different shapes and are identified as 56, 57 and 58, see FIG. 7. The contacts 56, 57 and 58 are of the same general configuration except the pins, 60, 61 and 62 respectively, are located at different positions.

The combs 55 are machined or molded, preferably of a strong polymeric electrically insulative material, and have a centrally disposed upper wall 64 having opposite ends. The wall 64 extends generally longitudinally of said comb 55 between the ends. The wall 64 has a top, opposite sides and a base formed by spaced depending legs 65 and 66. The legs 65 and 66 have oppositely outwardly projecting feet forming shelves 67 and 68, the top and bottom surfaces of which form anchoring means for the contacts 56, 57 and 58. The wall 64 is supported on opposite sides from the base 11 by thin spaced partitions or gussets 69, and the shelves 67 and 68 have similar aligned partitions 70 and 71, on their top and bottom surfaces respectively, between which are positioned the contacts 56, 57 and 58. Tabs 72 are positioned at each end of the wall 64 and extend to contact the base cover plate 50 as described above. The legs 65 and 66 diverge from each other and are spaced to define a groove therebetween large enough to receive the beam 35. Spaced along the sides of the legs 65 and 66 are cylindrical convex projections 75, which are parallel, affording line contact with opposite sides of a beam 35 to accurately position the support comb 55 on the beam 35. The base of the comb 55 has a recess 76 formed centrally thereof to receive the projection 36 for locating the comb 55 on the beam 35 longitudinally.

Each contact 56, 57 or 58 has a contact end 80 for making pressure contact with a contact pad on a TAB device or carrier, an intermediate body portion 81 affording movement of said contact end 80, and a pin 60, 61 or 62 defining a connecting end for making connection with the PC board of a piece of electronic test equipment. The contact end 80 has a straight portion 82 connected to a first arcuate flex area 83 of the intermediate portion 81 affording substantially straight line movement of the contact end 80 in relationship to the wall 64 of the comb 55. The first flex area 83 is joined to a reversely curved arcuate second flex area 84 affording movement of the contact end 80 in relationship to the wall 64 of the comb 55. The geometry of the contact end 80 and the wall 64 is such that in the movement of the contact end from its normal unflexed position of FIG. 7 to the flexed position illustrated in FIG. 5, may be completely rectilinear or, preferably with about 0.002 inch (0.05 mm) of horizontal movement to afford adequate wiping action on the test pad of the TAB device or carrier to remove any oxide that may have built up on the pad. The intermediate portion 81 also has a contact anchoring portion affording means for anchoring the contact to the comb 55. The anchoring portion of the intermediate body portion 81 comprises a pair of spaced cantilever beams 86 and 87 one of which engages the top surface of the foot or shelf 67 or 68 and the other 87, engages the bottom of the shelf. The beams 86 are provided with a barb 88 which mechanically engages the top of the shelf to help affix the contact on the comb between two spaced partitions 69, 70 and 71. The pins 60, 61 and 62 afford means to connect the contacts to a piece of electronic equipment, such as a PC board, a socket or other contacts.

With reference to FIG. 5, the lid 12 is provided with means to drive forcefully the pads of the TAB device or carrier vertically in a straightline direction toward the contact ends 80 of the contacts to make good electrical contact with the contacts 56, 57 and 58. The lid 12 has a rectangular frame 90 with a central rectangular opening 91 and a circular recess 92 in the upper surface surrounding the opening 91. Spaced bores in the frame recess 92 receive springs 94. The frame 90 supports the ears 13 and defines a lip to receive the pawl 17. Positioned in the recess 92 and extending through the rectangular opening 91 is a circular plate 95 having depending ribs 96 which terminate in flat surfaces in a plane to contact the surface of the TAB device or carrier opposite the pads. The opposite side of the plate 95 is formed with a plurality of arcuate inclined ramps or cam surfaces 98. Positioned above the ramped surface 98 of the plate 95 is an actuator member 100 in the form of a flat disc having a lever 101 extending radially outward from one edge and having a knob 102 fixed thereto. The disc 100 has a central opening 104 and spaced slots 105 positioned above the ramped surfaces 98. The slots 105 each receive a pair of cylindrical rollers 109 which engage the ramps 98 and afford vertical movement of the plate 95 upon rotation of the actuator disc 100. A top plate 110 is fastened above the frame 90 to resist the upward movement of the actuator 100, thus transferring the rotational movement of the actuator 100 into vertical movement of the plate 95 through the ramps and against the bias of springs 94. Top plate 110 is secured by PC board fastening screws to the base 90 to securely hold the two together.

The vertical movement of the plate 95 drives the TAB device or carrier against the contact ends of the contacts 56, 57 and 58 supported in the combs 55 on the beams 35. The central mounting of the combs 55 limits the expansion of the comb 55 to the longitudinal direction from the center projection 36 of the beams 35 and any movement of the beams 35 is longitudinal with respect to the same center point 36. Movement of the contact end 80 of the contacts 56, 57 and 58 is substantially vertical as illustrated and so restricts any buckling or other distortion of the TAB device by the contacts 56, 57 and 58.

There has been described a socket 10 which has proven very useful in the testing of TAB IC devices. However, the socket 10 does have some drawbacks. For example, it will be seen best in FIG. 7 that the contacts 56, 57 and 58 extend in opposite directions from the location of the contact tips 80. This means that the contact tips 80 cannot approach one another very closely in the corner areas of square array. This is seen very clearly in FIG. 1. Also, it will be difficult to reduce contact spacing in the future since the thickness of the partitions 69 and 70 will be reduced to a thinness which will make molding impractical.

Figure 9:
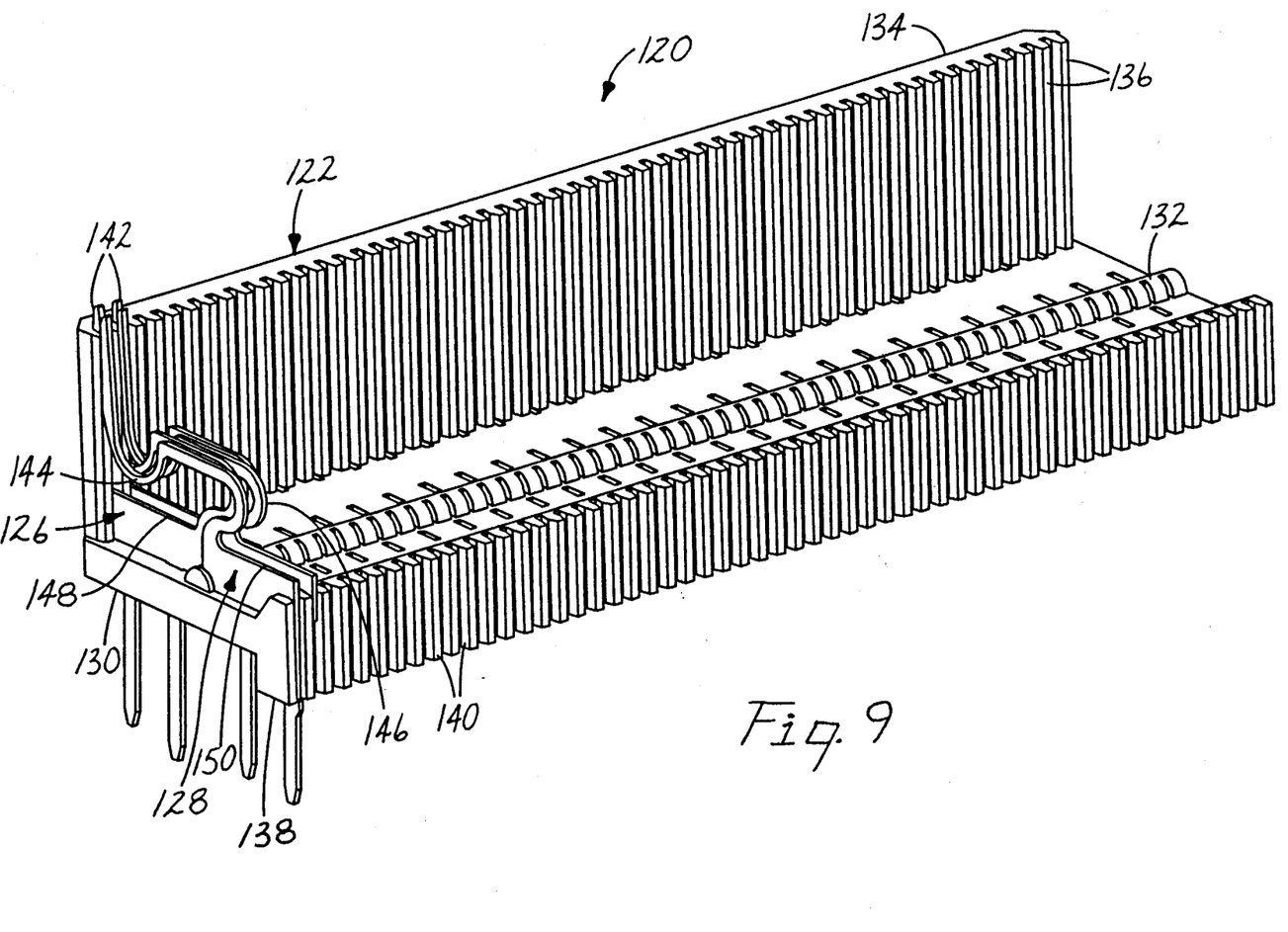
FIG. 9 is a perspective view of a contact support structure according to the present invention including only a few of the contacts to be utilized.
Figure 10:
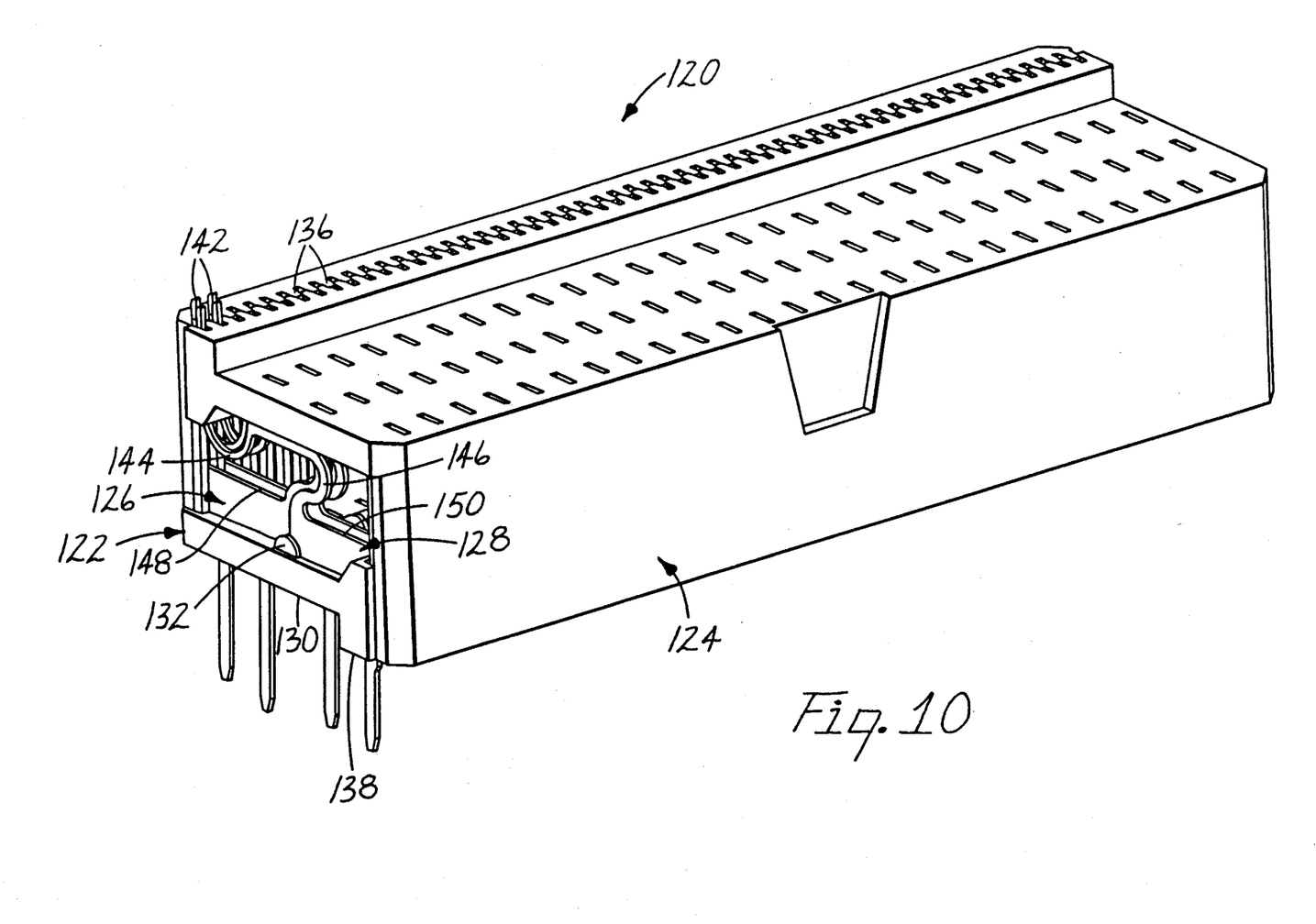
FIG. 10 is a perspective view of a contact guidance and retention module including the contact support structure of FIG. 9.
Figure 11:
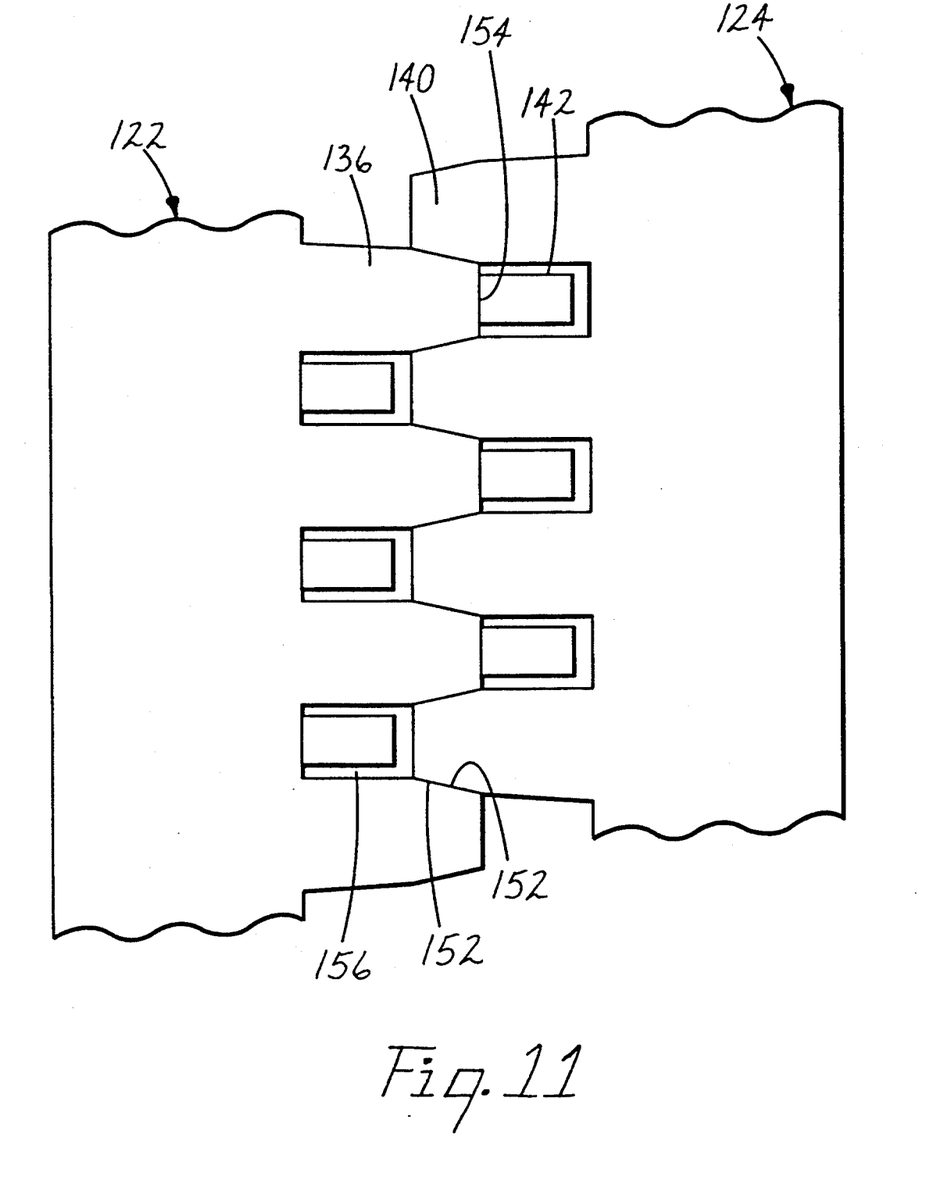
FIG. 11 is a plan view of a portion of the contact guidance and retention module of FIG. 10.

FIGS. 9, 10 and 11 illustrate a contact guidance and retention module, generally indicated as 120, according to the present invention which may be advantageously employed in a socket 10 such as that described above. The module is comprised of two identical contact support structures 122 and 124 which mate together to retain contacts 126 and 128 disposed therein.

Each contact support 122 or 124 includes a base 130 which is generally flat, a grooved ridge 132 down the center of the base 130 for retaining one end of the contacts 126 and 128, an upstanding wall 134 including gear-like teeth 136 in the nature of a gear rack, and a flattened, enlarged end 138 of the base 130 having teeth 140 like those of the wall 136.

The contacts 126 and 128 include extended terminal ends 142 which are connected to formed spring portions 144 and 146. The spring portions 144 and 146 allow the terminal ends 142 to conform to the TAB IC device and provide the upward force required to ensure good electrical contact between the terminal ends 142 and the IC. The contacts 126 and 128 are of two types in that their bases 148 and 150, respectively, extend in opposite directions from the spring portion 146.

As is best seen in FIG. 11, the gear-like teeth 136 and 140 are formed as projections which extend from valleys between each projection. The valleys are substantially rectangular when viewed from above, and the teeth 136 and 140 include tapered surfaces 152 terminating in truncated, flat ends 154.

The contacts 126 and 128 are arranged in the contact support 122 such that the terminal ends 142 are alternately disposed in the valleys between the teeth 136 and on the ends 154 of the teeth 136. Attachment of the remaining contact support 124 to the first contact support 122 results in mating of the tapered surfaces 152 of the contact supports 122 and 124, with the wall 136 and the enlarged end 138 of each contact support 122 and 124 engaging each other as is shown in FIG. 11.

The teeth 136 and 140 do not extend completely into the valleys between projections and so there is left a rectangular pocket 156 which retains and guides the contact ends 142, while allowing the terminal ends 142 to extend and retract along the length of the pockets 156. The contact terminal ends 142 are urged toward the extended position by the spring portions 144 and 146 of the contacts 126 and 128.

Figure 12:
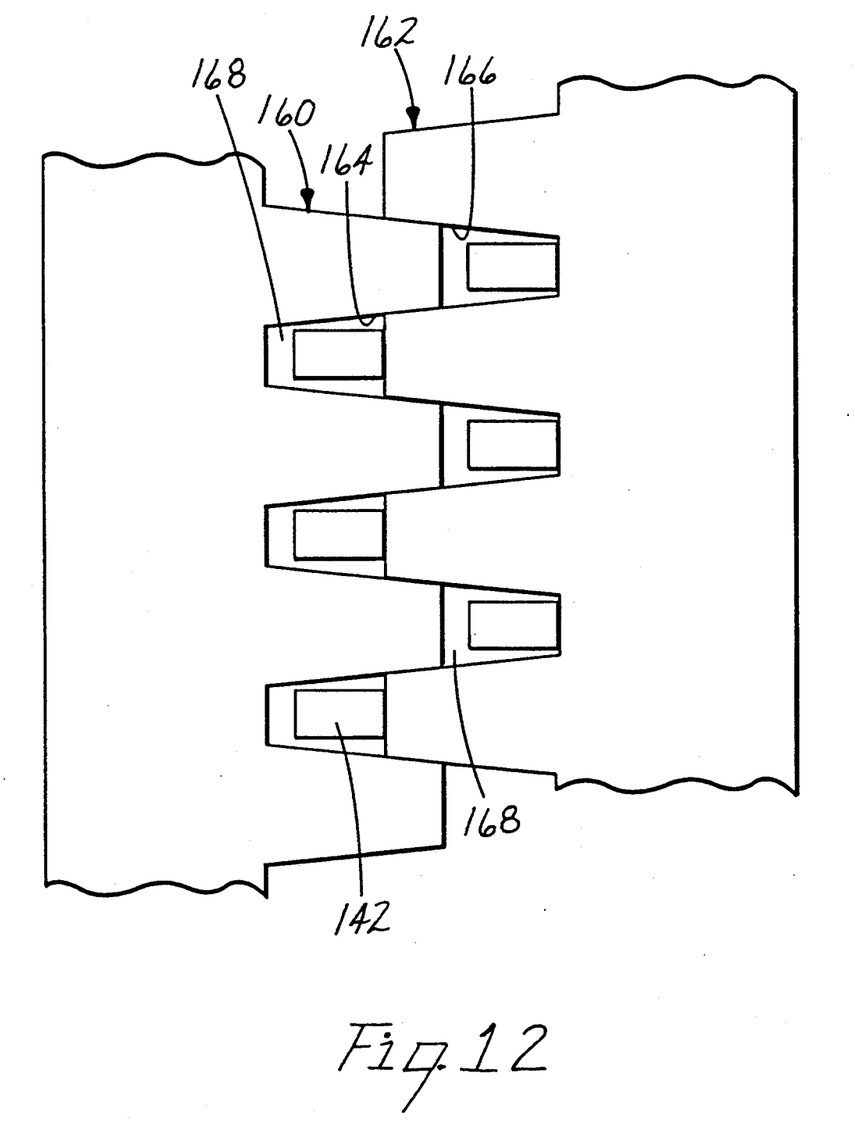
FIG. 12 is a plan view similar to FIG. 11 of a portion of a contact guidance and retention module according to an alternate embodiment of the invention.

FIG. 12 illustrates an alternate embodiment of the invention wherein the teeth 160 and 162 have continuously tapered sides 164 and 166 rather than dual-slope arrangement of the teeth 136 of FIG. 11. This arrangement results in a more triangular shaped pocket 168 than previously illustrated, but it is believed the pocket 168 would adequately guide the contact terminal ends 142 as required. FIG. 12 illustrates that many variations of the shape of the teeth are possible.

Four modules 120 such as that shown in FIG. 10 may be situated in recesses (like recesses 31-34 above) in a socket similar to that shown in FIGS. 1-8 to provide a rectangular grid which will correspond to a rectangular IC. One great advantage of the modules 120 of the present invention is that the contact bases 148 and 150 all extent in one direction from the position of the terminal ends 142 so the modules 120 can approach each other much closer in the corners of their rectangular formation than is possible when using former contact arrangements such as described in FIGS. 1-8.

Thus there has been described a test socket contact guidance and retention module which is economical to manufacture since it uses only one part in two roles and which is very robust and easy to mold since the contact ends are staggered, thus allowing thicker sections separating the contact terminal ends. in addition, the provision of contact terminal ends which extend from one side of the module permits contact ends to be disposed in greater proximity to another module of the same type.

Although the present invention has been described with respect to only a single embodiment, it will be apparent to those skilled in the art that many modifications may be made to the invention. For example, the socket 10 described with respect to FIGS. 1-8 has been discussed only to exemplify one type of socket with which the modules 120 can be used. Many other sockets could benefit from the teachings of the present invention. Sockets for use with leaded rather than TAB type devices could benefit by the invention if the cover of the socket were provided with means for pressing the leads of the device against the contact tips. Any number of modules can be used in a socket and in any arrangement, such variables depending only on the shape of the device which the socket must accommodate.

We claim:

1. A contact guidance and retention module for a test socket for an electronic device comprising:
   a first contact support structure including linear gear-like teeth defined by projecting tapered ribs and valleys between adjacent ribs;
   contacts including projecting contact tips disposed within said first contact structure and arranged such that said tips of adjacent contacts are disposed one in said valley between adjacent ribs and the other aligned with said projecting rib of said first contact support structure;
   a second contact support structure including linear gear-like teeth defined by projecting tapered ribs and valleys between adjacent ribs;
   wherein said teeth of said first contact structure and said second contact structure intermesh with the ribs of one contact support structure extending only partially into the valleys between ribs of the other of said contact support structures to define a pocket at said valleys of said first contact structure and said valleys of said second contact structure which contain and guide contact tips contained therein.

2. A contact guidance and retention structure according to claim 1 wherein said teeth of said first contact structure and said teeth of said second contact structure taper from said valleys between said teeth and terminate in flat surfaces.

3. A contact guidance and retention structure according to claim 1 wherein said first contact support structure and said second contact support structure are identical and interlock to retain said contacts therebetween.

4. A test socket for the electronic testing of electronic devices having contacting surfaces arranged in a rectangular array, the test socket comprising:

four contact guidance and retention structures disposed in a rectangular arrangement to correspond to the contacting surfaces of the electronic device, each contact guidance and retention module including:

a first contact support structure including linear gear-like teeth defined by projecting tapered ribs and valleys between adjacent ribs;

contacts including projecting contact tips disposed within said first contact structure and arranged such that said tips of adjacent contacts are disposed one in said valley between adjacent ribs and the other aligned with said projecting rib of said first contact support structure;

a second contact support structure including linear gear-like teeth defined by projecting tapered ribs and valleys between adjacent ribs;

wherein said teeth of said first contact structure and said second contact structure intermesh with the ribs of one contact support structure extending only partially into the valleys between ribs of the other of said contact support structures to define a pocket at said valleys of said first contact structure and said valleys of said second contact structure which contain and guide contact tips contained therein.

* * * * *